(12) United States Patent
Takizawa

(10) Patent No.: US 9,214,877 B2
(45) Date of Patent: Dec. 15, 2015

(54) GATE DRIVING CIRCUIT HAVING A FAULT DETECTING CIRCUIT FOR A SEMICONDUCTOR SWITCHING DEVICE

(71) Applicant: FUJI ELECTRIC CO., LTD., Kawasaki-shi (JP)

(72) Inventor: Satoki Takizawa, Hino (JP)

(73) Assignee: FUJI ELECTRIC CO., LTD. (JP)

( * ) Notice: Subject to any disclaimer, the term of this patent is extended or adjusted under 35 U.S.C. 154(b) by 330 days.

(21) Appl. No.: 14/042,806

(22) Filed: Oct. 1, 2013

(65) Prior Publication Data

US 2014/0098581 A1   Apr. 10, 2014

(30) Foreign Application Priority Data

Oct. 9, 2012   (JP) ................. 2012-223842

(51) Int. Cl.
*H03K 17/687*   (2006.01)
*H02M 7/537*   (2006.01)
*H02M 7/538*   (2007.01)
*G01R 31/02*   (2006.01)
*H03K 17/082*   (2006.01)
*H02M 1/32*   (2007.01)
*G01R 31/327*   (2006.01)
*G01R 31/26*   (2014.01)

(52) U.S. Cl.
CPC .............. *H02M 7/537* (2013.01); *G01R 31/025* (2013.01); *H02M 7/538* (2013.01); *H03K 17/0822* (2013.01); *G01R 31/2607* (2013.01); *G01R 31/327* (2013.01); *H02M 1/32* (2013.01); *H03K 2217/0027* (2013.01); *H03K 2217/0063* (2013.01); *H03K 2217/0072* (2013.01)

(58) Field of Classification Search
CPC ....................................................... H03K 7/687
See application file for complete search history.

(56) References Cited

U.S. PATENT DOCUMENTS 8,896,364 B2 *   11/2014   Hafner .................... H02H 3/05
327/427

FOREIGN PATENT DOCUMENTS

| JP | 2008-118728 A | 5/2008 |
| JP | 2009-089152 A | 4/2009 |
| JP | 2010-288416 A | 12/2010 |

* cited by examiner

*Primary Examiner* — Hai L Nguyen
(74) *Attorney, Agent, or Firm* — Rossi, Kimms & McDowell LLP

(57) ABSTRACT

Aspects of the invention are directed to a gate driving circuit for a power conversion circuit having an upper and lower arm circuit composed of series-connected upper arm and a lower arm, each arm including two or more semiconductor switching devices connected in series. In some aspects, a gate driving circuit of the invention includes a circuit of series connection including a diode and a resistor between a positive potential side of a positive side power supply and a positive electrode side. The gate driving circuit can determine a short-circuit fault of the semiconductor switching device that is connected to the gate driving circuit by detecting the current that flows through the circuit of series connection including the diode and the resistor when an OFF command of ON/OFF command signals is given to the semiconductor switching device.

9 Claims, 11 Drawing Sheets operation example in a normal turning ON operation example in a short-circuit fault in the other arm operation example in a normal turning OFF operation example in a short-circuit fault in the own arm

GATE DRIVING CIRCUIT HAVING A FAULT DETECTING CIRCUIT FOR A SEMICONDUCTOR SWITCHING DEVICE

CROSS-REFERENCE TO RELATED APPLICATION

This application is based on, and claims priority to, Japanese Patent Application No. 2012-223842, filed on Oct. 9, 2012, the contents of which are incorporated herein by reference in their entirety.

BACKGROUND OF THE INVENTION

1. Field of the Invention

Embodiments of the invention relate to gate driving circuits for series-connected power semiconductor switching devices installed in high voltage power conversion circuits.

2. Description of the Related Art

FIG. 7 shows an example of a two-level inverter circuit, which is a power conversion circuit for converting a DC power to an AC power. A DC power supply 1 has a positive terminal P and a negative terminal N. Such a DC power supply 1 can be generally composed from an AC power supply system by utilizing a rectifier and a high capacity capacitor, which are not shown in the figure.

This power conversion circuit is a three-phase inverter circuit having the upper and lower arms for the U phase, the upper and lower arms for the V phase, and the upper and lower arms for the W phase, the three pairs of upper and lower arms being connected in parallel between the P terminal and the N terminal of the DC power supply 1. A load of an AC motor 11 is connected to the U, V, and W terminals of the three-phase inverter circuit. Since each phase has the same construction, description is solely given about the U phase. The power conversion circuit of FIG. 7 uses IGTBs for semiconductor switching devices. Four series-connected IGBTs 2 through 5, each having an anti-parallel-connected diode, compose the upper arm, and four series-connected IGBTs 6 through 9, each having an anti-parallel-connected diode, compose the lower arm. Each arm comprises a plurality of semiconductor switching devices connected in series because each switching device must be secured to withstand against a high voltage of the power supply 1 that is higher than the withstand voltage of a single semiconductor switching device. The four series-connection in each arm is just an example, and an appropriate number of series connection is determined considering the voltage value of the power supply 1 and the withstand voltage of the semiconductor switching device.

A withstand voltage $V_{CES}$ of a semiconductor switching device used in the two-level inverter system can be determined by the rule of thumb below.

$$Ed = V_{CES} \times n/2,$$

where n is the number of series-connected devices in one arm and the $V_{CES}$ is a withstand voltage between a collector and an emitter of the semiconductor switching device.

Gate driving circuits 12 through 19 drive the respective IGBTs 2 through 9 according to the signals given from a control circuit, which is not shown in the figure. Resistors 20 through 27 are connected between the collector and emitter of the respective IGBTs 2 through 9 for the purpose of equaling the voltage to which each of IGBTs, for example IGBTs 2 through 5, connected in series is subjected in the OFF state of the IGBTs.

FIG. 8 shows an example of gate driving circuit. A gate driving signal 29 from a control circuit 28 is given to an upper arm gate driving circuit 30 and a lower arm gate driving circuit 31. An inverter gate 32 is provided in order to deliver opposite signals to the upper arm and the lower arm. Dead time circuits 33 and 34 that delay the rising up time of an ON signal are provided in order to avoid overlapping of ON periods of the upper arm IGBTGs 2 through 5 and the lower arm IGBTs 6 through 9. Photo-couplers are provided in each gate driving circuit in order to isolate a weak electric side (or a signal side) from a heavy electric side (or a power side).

FIG. 9 shows the gate driving circuit more in detail. The gate driving circuit comprises: a photo-coupler 35 to isolate the input signal, transistors 36 and 37 to amplify a signal, a base resistor 38 for the transistors 36 and 37, a gate resistor 39 to adjust the switching speed of the IGBT, and positive and negative power supplies 40 and 41 for the driving circuit.

In short-circuit fault of an IGBT in another arm in general, if a normal IGBT is turned ON, power supply short-circuit occurs as shown in FIG. 10. Whereas the explanation is made on a common two-level circuit, the situation is in principle as same as in a multilevel circuit and a circuit having a plurality of IGBTs connected in series. In this situation, the normal IGBT suffers from overcurrent and is subjected to the power supply voltage between the collector and emitter of the IGBT. In order to detect this phenomenon, as shown in FIG. 9, a diode 42 is connected to the collector of the IGBT S1. An ON command to the IGBT S1 generates current flow into the diode 42 through a resistor 43. Since the collector-emitter voltage in an ON state of the IGBT is only several volts in a normal condition, the potential at the point B is also several volts. When a short-circuit current flows, the voltage between the corrector and emitter of the IGBT S1 grows up to several hundred volts; the diode 42 turns OFF, and the potential at the point B begins to rise toward the voltage of the positive side power supply 40 of the gate driving circuit. However, the voltage is clamped by the voltage of the Zener diode 45. The Zener diode 45 turns ON and the transistor 46 in turn becomes an ON state. The potential of the gate of the IGBT S1 equals the emitter potential of the IGBT, and thus, the IGBT S1 is forcedly turned OFF.

With the turning ON of the transistor 46, a current flows in the photo-diode in the primary side of the photo-coupler 47 through the resistor 48. Thus, information of arm short-circuit is transmitted to the photo-transistor in the secondary side of the photo-coupler 47. The series-connected circuit of the resistor 43 and a capacitor 44 is a timer circuit to prevent the transistor 46 from turning ON in the process of rising up of an ON signal and turning ON of the IGBT S1 until the collector-emitter voltage drops to several volts.

Japanese Unexamined Patent Application Publication No. 2008-118728 (also referred to herein as "Patent Document 1") discloses an example of an inverter circuit with each of upper and lower arms having series-connected IGBTs. Further, Japanese Unexamined Patent Application Publication No. 2010-288416 (in FIG. 2 in particular) discloses an example of gate driving circuit that detects a short-circuit fault of the other arm.

In a system having a plurality of series-connected IGBTs in each of the upper and lower arms as shown in FIG. 7, there are some discrepancies between switching timings of the IGBTs, thus, each IGBT does not bear the exactly equal voltage.

This inequality is usually taken into consideration in the design of dielectric strength to determine a withstand voltage and the number of series connection of IGBTs. If the design value of voltage or current is surpassed in actual operation, however, the IGBT might break down.

When one device of series connected devices is short-circuited, the other normal devices must bear the voltage, which increases the voltage that must be withstood by one device. The result is an avalanche of breakdown of the remained series-connected devices and breakdown of the entire arm finally occurs. When the entire arm, the upper arm in the example shown in FIG. 11, is broken down and short-circuited, and the other arm, the lower arm in the example, is given an ON signal, DC power supply short-circuit arises, which generates heavy short-circuit current as indicated by the broken line, causing a large scale breakdown of the converter circuit.

Patent Document 1 discloses a circuit for detecting a fault of series-connected semiconductor switching devices. This circuit however, needs a resistor for high power connected in parallel to the IGBT and in addition, requires a circuit for detecting the current through the resistor or the voltage across the resistor. Thus, the circuit may enlarge the device and raises the cost. Thus, as described above, there exists certain shortcomings in the related art.

SUMMARY OF THE INVENTION

Embodiments of the invention address these and other shortcomings. Certain embodiments provide such a small-sized and low cost gate driving circuit having a circuit for detecting a fault of a semiconductor switching device that detects a short circuit fault of a semiconductor switching device without adding any component to the main circuit of the power conversion circuit but only adding some electronic circuits into the gate driving circuit.

A first aspect of the present invention is a gate driving circuit having a circuit for detecting a short-circuit fault of a semiconductor switching device, the gate driving circuit driving semiconductor switching devices in a power conversion circuit for converting a DC power to an AC power or converting an AC power to a DC power, the power conversion circuit comprising a DC power supply and an upper and lower arm circuit composed of an upper arm and a lower arm connected in series, each arm comprising two or more semiconductor switching devices connected in series, each semiconductor switching device having an anti-parallel connected diode, and the gate driving circuit being connected in parallel to the DC power supply and the upper and lower arm circuit, wherein the gate driving circuit comprises a series circuit including a diode and a resistor between a positive potential terminal of a positive side power supply of the gate driving circuit and a positive electrode of the semiconductor switching device (the collector electrode of an IGBT or the drain electrode of a MOSFET), and determines a short-circuit fault of the semiconductor switching device connected with the gate driving circuit by means of a current that flows through the series circuit including the diode and the resistor upon receiving an OFF command of ON/OFF command signals to the semiconductor switching device.

A second aspect of the invention is the gate driving circuit having a circuit for detecting a short-circuit fault of a semiconductor switching device according to the first aspect of the invention, wherein the gate driving circuit comprises a circuit for detecting a power supply short-circuit current from the DC power supply that flows when the other arm of opposing upper and lower arms becomes into a short-circuit fault state.

A third aspect of the invention is the gate driving circuit having a circuit for detecting a short-circuit fault of a semiconductor switching device according to the first or the second aspect of the invention, wherein the gate driving circuit comprises a bypass circuit that prohibits current flow through the diode in the series circuit including the diode and the resistor upon receiving an ON command of ON/OFF command signals to the semiconductor switching device.

A fourth aspect of the invention is the gate driving circuit having a circuit for detecting a short-circuit fault of a semiconductor switching device according to the first or the second aspect of the invention, wherein the series circuit including the diode and the resistor is a series connected circuit comprising the diode, the resistor, and further, a Zener diode.

A fifth aspect of the invention is the gate driving circuit having a circuit for detecting a short-circuit fault of a semiconductor switching device according to the first or the second aspect of the invention, wherein the series circuit including the diode and the resistor comprises a primary side device of a photo-coupler disposed on a current path through the series circuit, and transmits a short-circuit fault state of the semiconductor switching device to a secondary side of the photo-coupler by means of a current flowing through the series circuit comprising the diode, the resistor, and the photo-coupler.

A sixth aspect of the invention is the gate driving circuit having a circuit for detecting a short-circuit fault of a semiconductor switching device according to the fifth aspect of the invention, wherein a photo-coupler for detecting a short-circuit fault of a semiconductor switching device in one of the upper and lower arms serves simultaneously as a photo-coupler for transmitting detection of an arm short-circuit current in a short-circuit fault of a semiconductor switching device in the other arm to the secondary side of the photo-coupler.

A seventh aspect of the invention is the gate driving circuit having a circuit for detecting a short-circuit fault of a semiconductor switching device according to the sixth aspect of the invention, wherein the gate driving circuit comprises a circuit, in the secondary side of the photo-coupler, for determining whether a short-circuit fault has occurred in a semiconductor switching device in the own arm of the upper and lower arms or in a semiconductor switching device in the other arm using an ON or OFF switching command to the semiconductor switching device.

An eighth aspect of the invention is the gate driving circuit having a circuit for detecting a short-circuit fault of a semiconductor switching device according to any one of the fifth, sixth, and seventh aspects of the invention, wherein the signal transmission to a circuit disposed in the secondary side of the photo-coupler is performed by means of an isolating component including an optical fiber and a transformer in place of the photo-coupler.

The ninth aspect of the invention is the gate driving circuit having a circuit for detecting a short-circuit fault of a semiconductor switching device according to the seventh aspect of the invention, wherein the gate driving circuit comprises a masking circuit that prohibits determining operation during a dead time period in a process for determining, in the secondary side of the photo-coupler, whether a short-circuit fault has occurred in a semiconductor switching device of the own arm or of the other arm using an OFF switching command to the semiconductor switching device.

Embodiments of the invention include a gate driving circuit for a power conversion circuit having an upper and lower arm circuit composed of series-connected upper arm and a lower arm, each arm comprising two or more semiconductor switching devices connected in series. A gate driving circuit of embodiments of the invention comprises a circuit of series connection including a diode and a resistor between a positive potential side of a positive side power supply and a positive electrode side for example collector electrode side of the semiconductor switching device. In some embodiments, the gate driving circuit determines a short-circuit fault of the semiconductor switching device that is connected to the gate driving circuit by detecting the current that flows through the circuit of series connection including the diode and the resistor when an OFF command of ON/OFF command signals is given to the semiconductor switching device.

Consequently, a short-circuit fault of embodiments of the semiconductor switching device is detected without additional component to the main circuit of the power conversion circuit to interrupt the system safely. Therefore, the power conversion system can be achieved in a small size and at a low cost.

DETAILED DESCRIPTION

Embodiments of the invention provides, in the gate driving circuit thereof, a protection circuit technology that detects a short-circuit fault of one switching device and avoids expansion of the breakdown over a wide range of the conversion circuit. Here, the design of withstand voltage of the switching devices, for example IGBTs, assumes that in the case of a short-circuit fault of a single switching device, the IGBTs that have not suffered breakdown can bear a specified withstand voltage owing to the situation in which an enough number of series connection of IGBTs are provided, and a certain degree of margin is given to the withstand voltage against a quasi-static turning OFF because the withstand voltage has been determined in consideration of transient phenomena in the switching process and the unbalanced sharing of voltage.

A gate driving circuit of some embodiments is for a power conversion circuit having an upper and lower arm circuit composed of series-connected upper arm and a lower arm, each arm comprising two or more semiconductor switching devices connected in series. A gate driving circuit of some embodiments comprises a circuit of series connection including a diode and a resistor between a positive potential side of a positive side power supply and a positive electrode side for example a collector electrode side of an IGBT or a drain electrode side of a MOSFET. The gate driving circuit determines a short-circuit fault of the semiconductor switching device that is connected to the gate driving circuit by detecting the current that flows through the circuit of series connection including the diode and the resistor when an OFF command of ON/OFF command signals is given to the semiconductor switching device.

[Embodiment Example 1]

Figure 1:
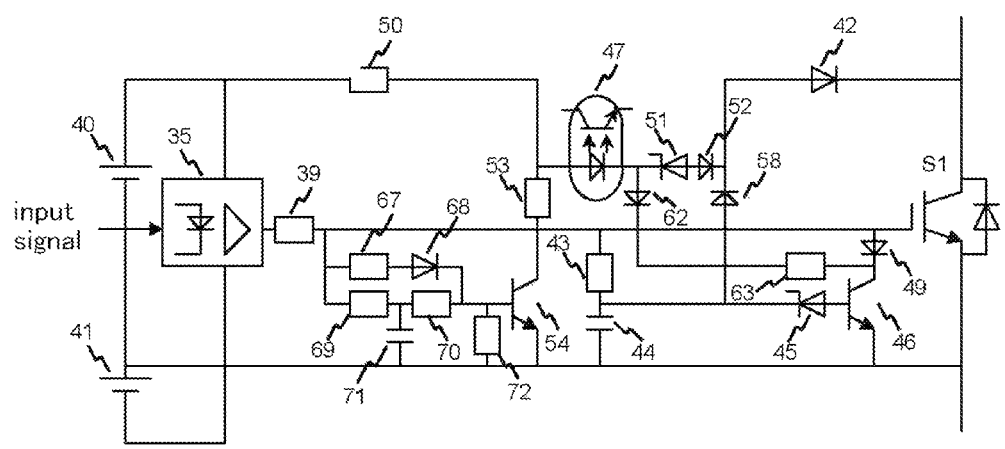
FIG. 1 shows an example of gate driving circuit according to a first embodiment of the present invention.
Figure 8:
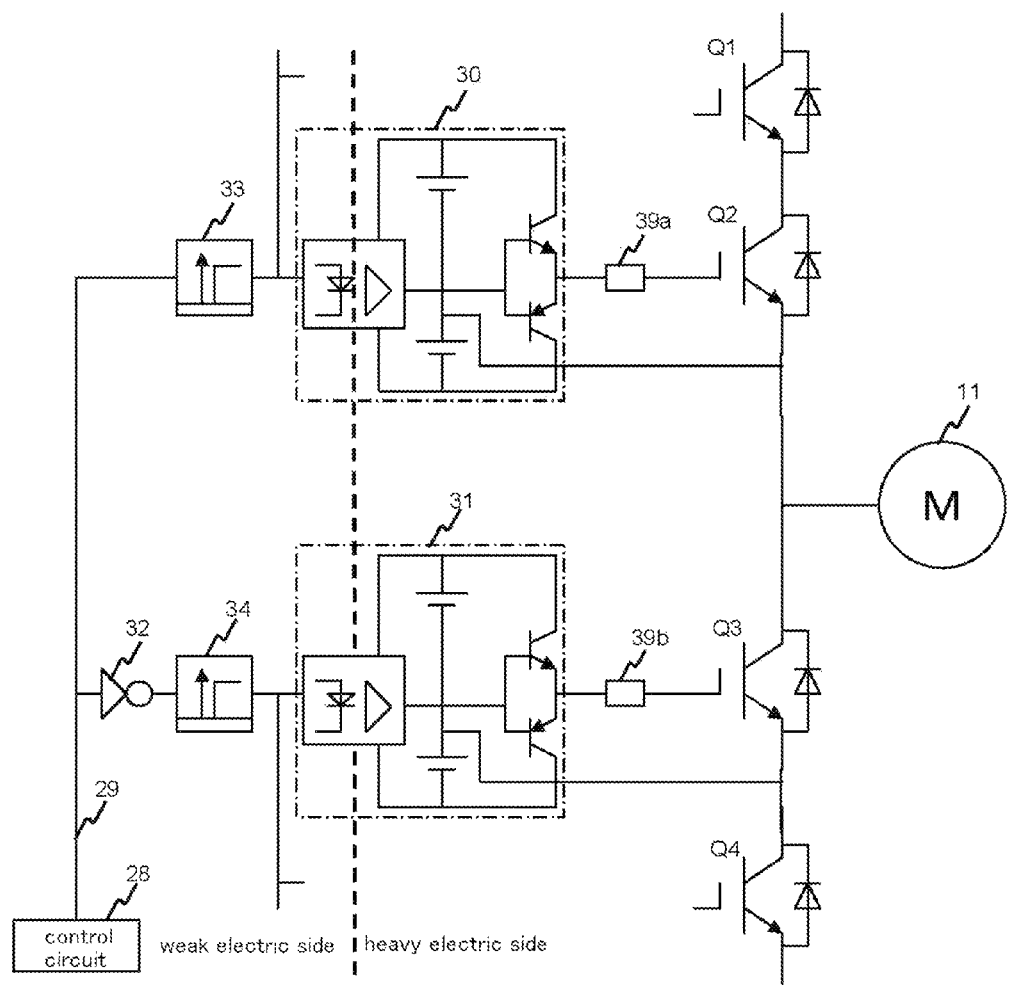
FIG. 8 shows an example of gate driving circuit according to a traditional technology.
Figure 9:
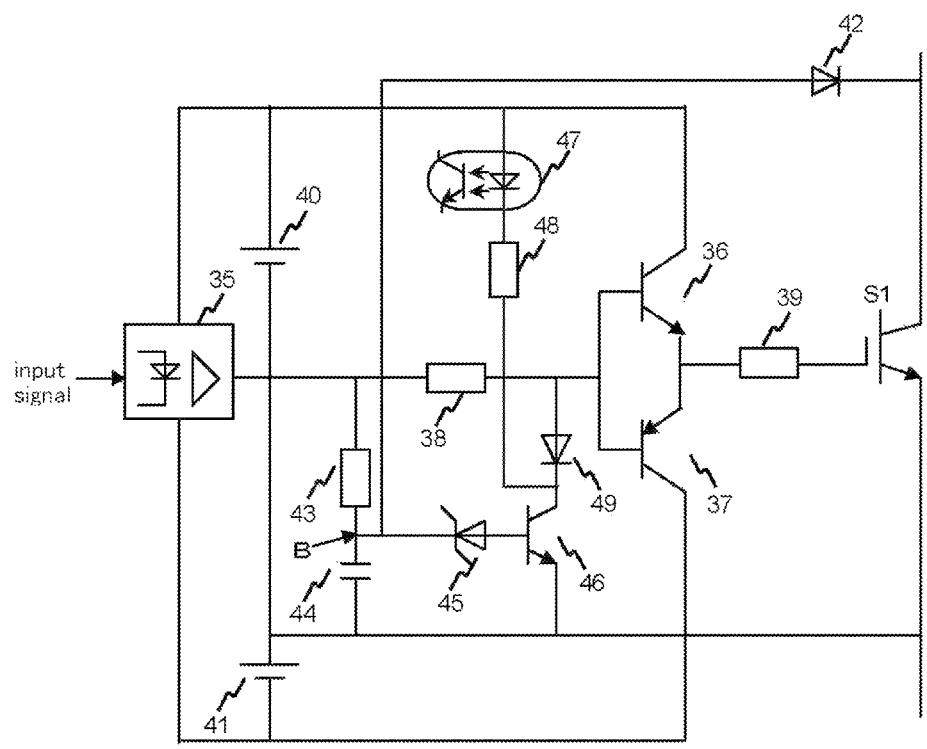
FIG. 9 shows an example of conventional gate driving circuit that has an overcurrent protection circuit.
Figure 10:
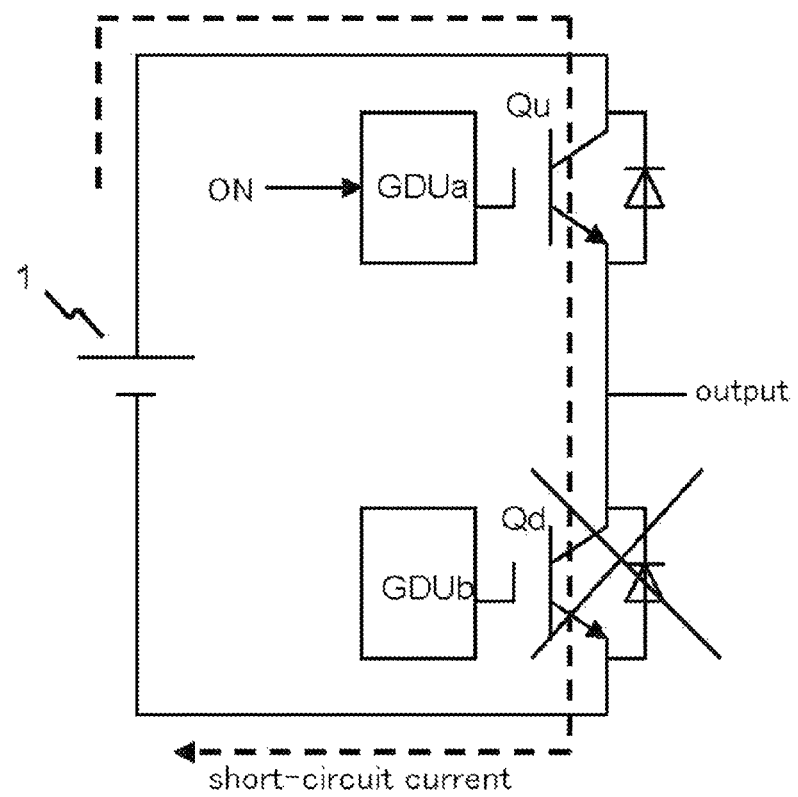
FIG. 10 is a schematic drawing to illustrate DC power supply short-circuit.
Figure 11:
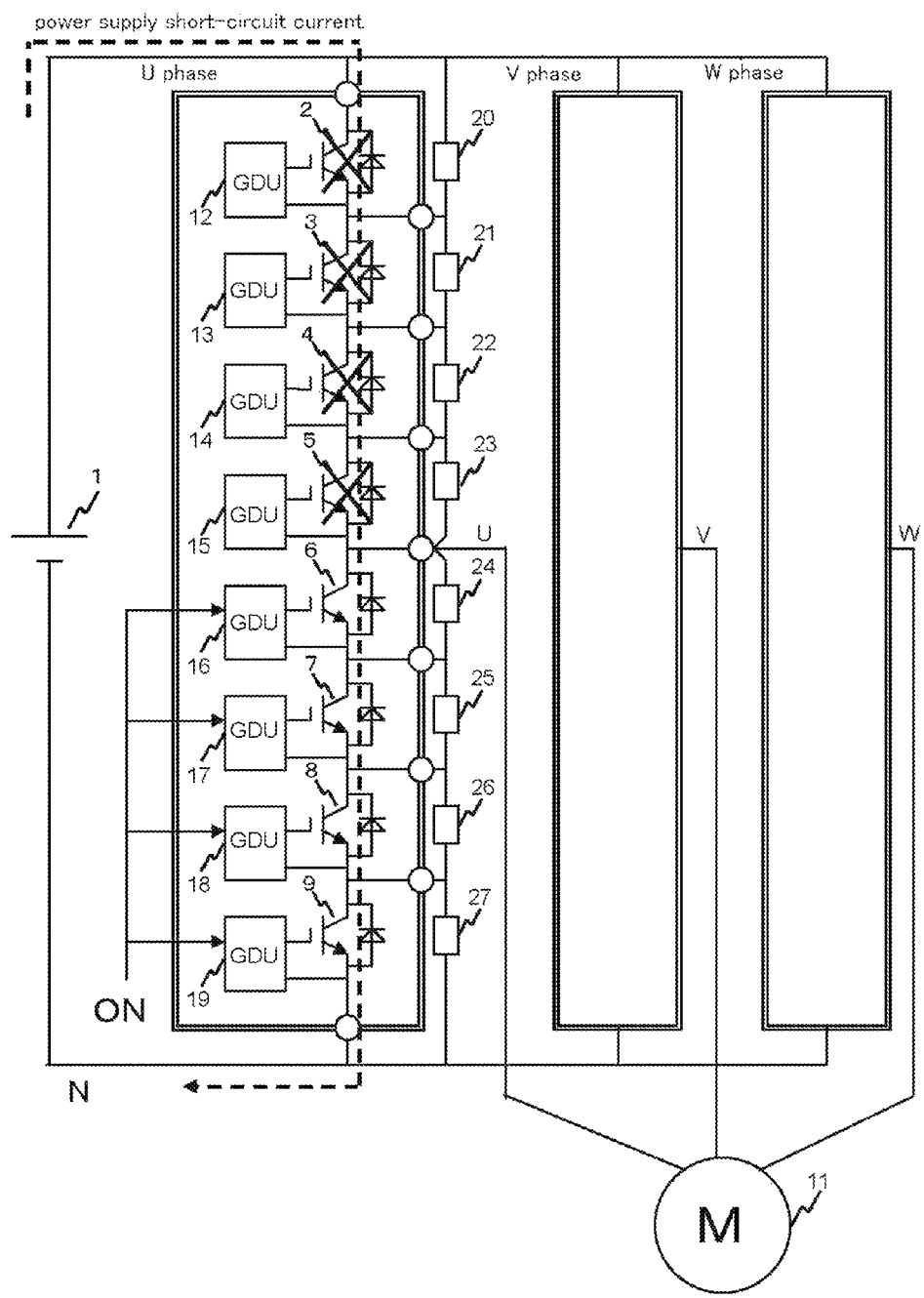
FIG. 11 shows power supply short-circuit in a two-level inverter circuit comprising a multiple of series-connected switching devices.

FIG. 1 shows a gate driving circuit according to the first embodiment of the invention. In addition to the traditional circuit of FIG. 9 provided are a resistor 50, a Zener diode 51, and a diode 52 to detect a short-circuit fault state of the IGBT on receiving an OFF command. Though omitted in FIG. 1, the transistors 36 and 37 for signal amplification shown in the traditional gate driving circuit of FIGS. 8 and 9 can be provided in the circuit of the invention shown in FIG. 1.

Figure 5:
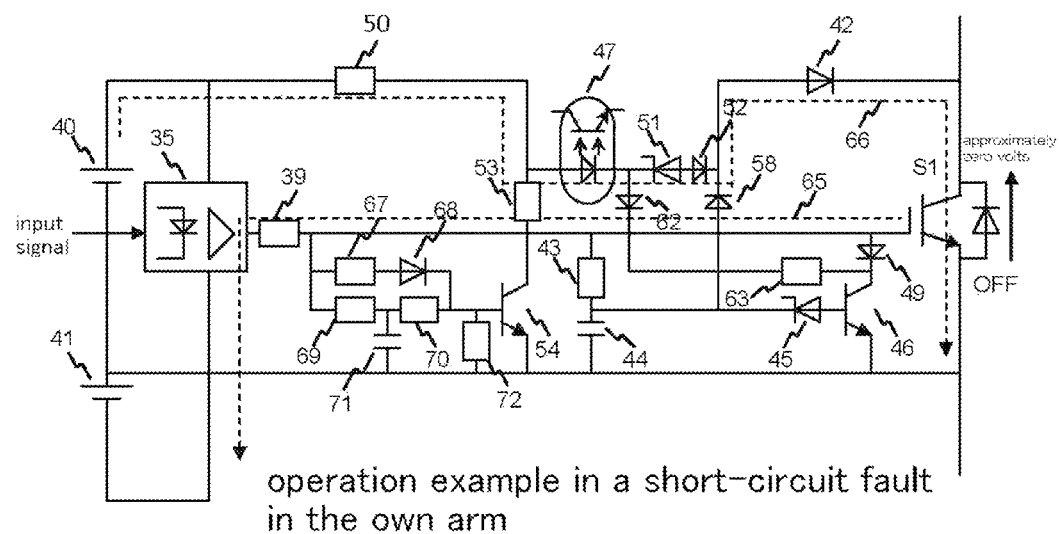
FIG. 5 shows a fourth operation mode in the example of gate driving circuit according to the first embodiment of the present invention.

To prohibit current flow through the Zener diode 51 and the diode 52 under an ON command, a bypass circuit is provided that is a series circuit of a resistor 53 and a transistor 54 connected between the connection point of the resistor 50 and a primary side diode of a photo-coupler 47 and the emitter potential of the IGBT S1. A gate driving circuit for the transistor 54 comprises resistors 67, 69, 70, 72, a diode 68, and a capacitor 71 and turns fast the transistor 54 ON at rising up of an ON signal and turns with a certain delay the transistor 54 OFF at falling down of the ON signal. Because it takes a certain period of time to actually turn OFF the IGBT even though an OFF command is given to a photo-coupler 35, the transistor 54 is made remaining in an ON state during that period of time in order to prevent such a current 66 as shown in FIG. 5 from flowing.

Figure 2:
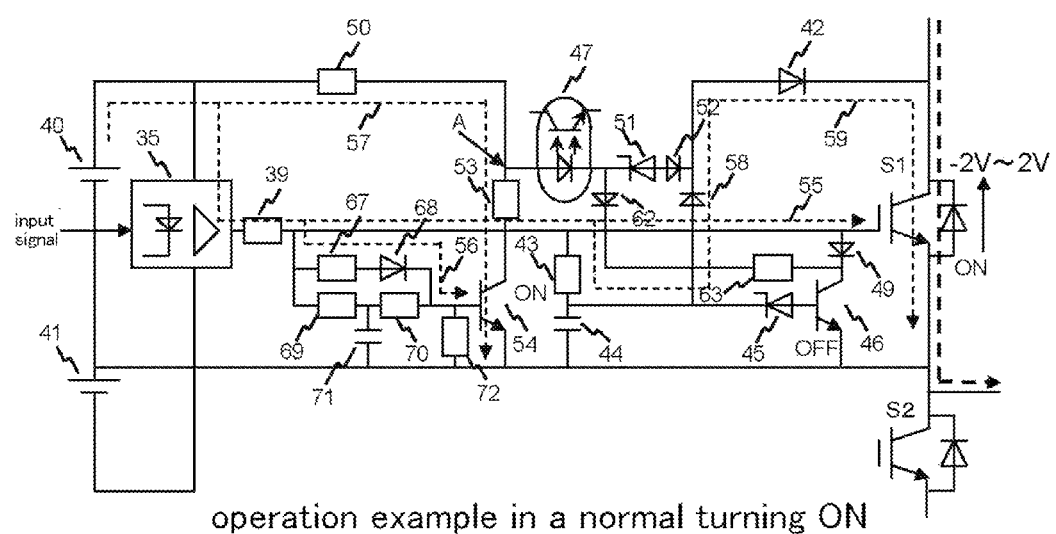
FIG. 2 shows a first operation mode in the example of gate driving circuit according to the first embodiment of the present invention.

FIG. 2 shows an example of operation mode when an ON command is given in a normal state of the circuit of FIG. 1. The output of the photo-coupler 35 turns to a high level (an H level) and a current 55 flows into the gate of the IGBT S1 to turn it ON. At the same time, a current 56 is delivered to the base of the transistor 54 through the resistor 67 and the diode 68 to turn the transistor 54 ON. Upon turning ON of the transistor 54, a current 57 flows from a positive side power supply 40 through the resistor 50 and the resistor 53. Here, the connection point A between the resistor 50 and the resistor 53 is at a potential value determined by dividing the voltage of the positive side power supply 40 with the resistors 50 and 53. By setting this divided voltage to be lower than the Zener voltage of the Zener diode 51, no current flows through the primary side diode of the photo-coupler 47. Similarly to a traditional circuit, a current 59 flows upon turning ON of the IGBT S1 through the resistor 43 and diodes 58 and 42.

Figure 3:
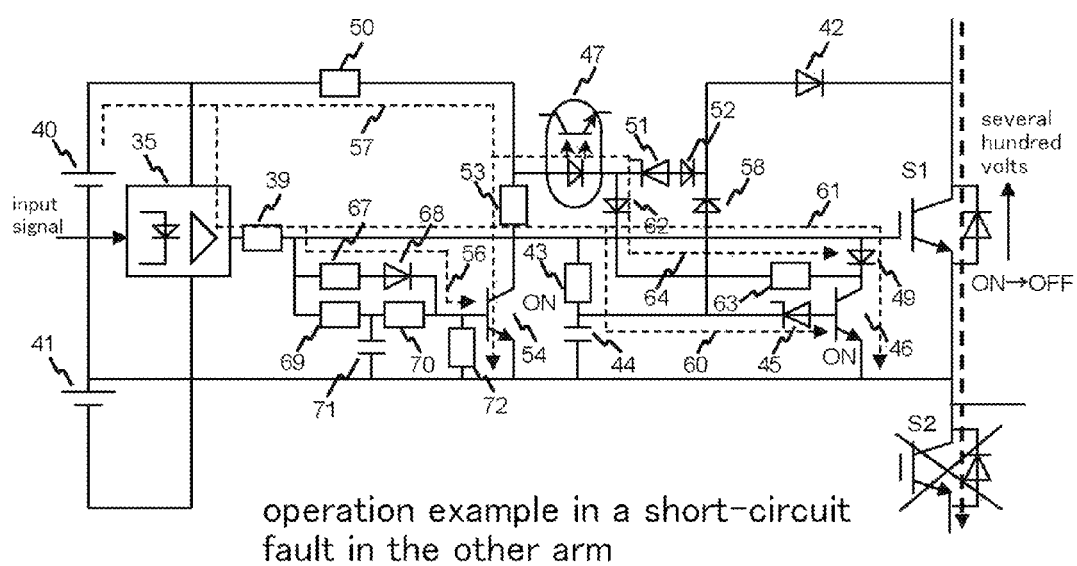
FIG. 3 shows a second operation mode in the example of gate driving circuit according to the first embodiment of the present invention.

FIG. 3 shows an example of operation mode when a short-circuit fault has occurred in an IGBT in the other arm of the opposing upper and lower arms in the circuit of FIG. 1. The IGBT S1 is subjected to a high voltage of several hundred volts as in a traditional circuit. The current 59 indicated in FIG. 2 does not flow but a current 60 flows through a Zener diode 45 and the base of a transistor 46 to turn the transistor 46 ON. As a result, the current that has been flowing through the gate of the IGBT S1 deviates from the IGBT S1 to become a current 61 through a diode 49 and the transistor 46. The gate of the IGBT S1 becomes at a potential equal to the emitter potential and the IGBT S1 is turned OFF forcedly. The turning ON of the transistor 46 allows current flow 64 from the positive side power supply 40 through the resistor 50, the primary side diode of the photo-coupler 47, a diode 62, and a resistor 63. This current 64 transmits fault information to the secondary side of the photo-coupler 47.

Figure 4:
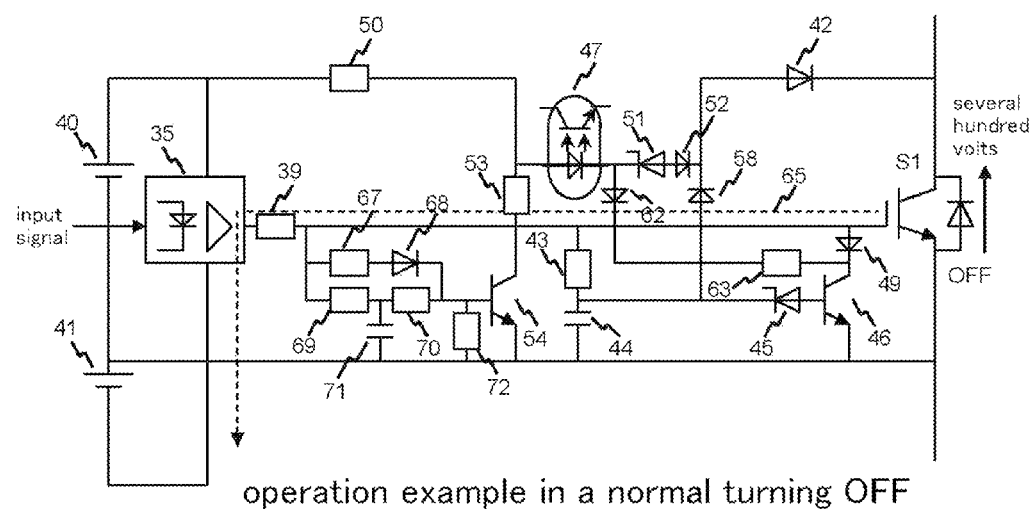
FIG. 4 shows a third operation mode in the example of gate driving circuit according to the first embodiment of the present invention.

FIG. 4 shows an example of operation mode when an OFF command is given in a normal state of the circuit of FIG. 1.

The output of the photo-coupler 35 becomes to a low level (an L level) and the gate-emitter of the IGBT S1 is reversely biased and a current 65 flows to turn OFF the IGBT S1.

FIG. 5 shows an example of operation mode when an IGBT of the own arm in the circuit of FIG. 1 is in a short-circuit fault state. Despite no input of OFF command, the IGBT S1 undergoes virtually zero volts. A current 66 flows from the positive side power supply 40 through the resistor 50, the primary side diode of the photo-coupler 47, the Zener diode 51, the diode 52, and the diode 42. Thus, a short-circuit fault information is transmitted to the secondary side of the photo-coupler 47. The transmission of the fault information to the secondary side can be carried out by means of an optical fiber or a pulse transformer, for example, in place of the photo-coupler 47.

[Embodiment Example 2]

Figure 6:
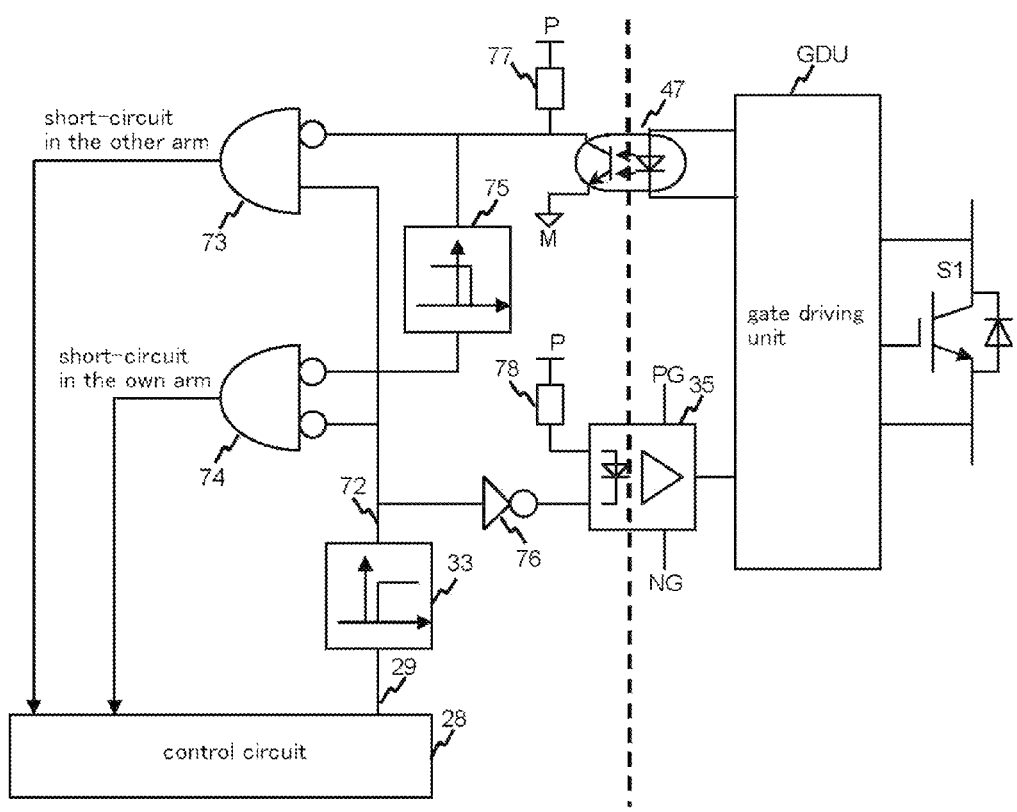
FIG. 6 shows an example of gate driving circuit according to the second embodiment of the present invention.
Figure 7:
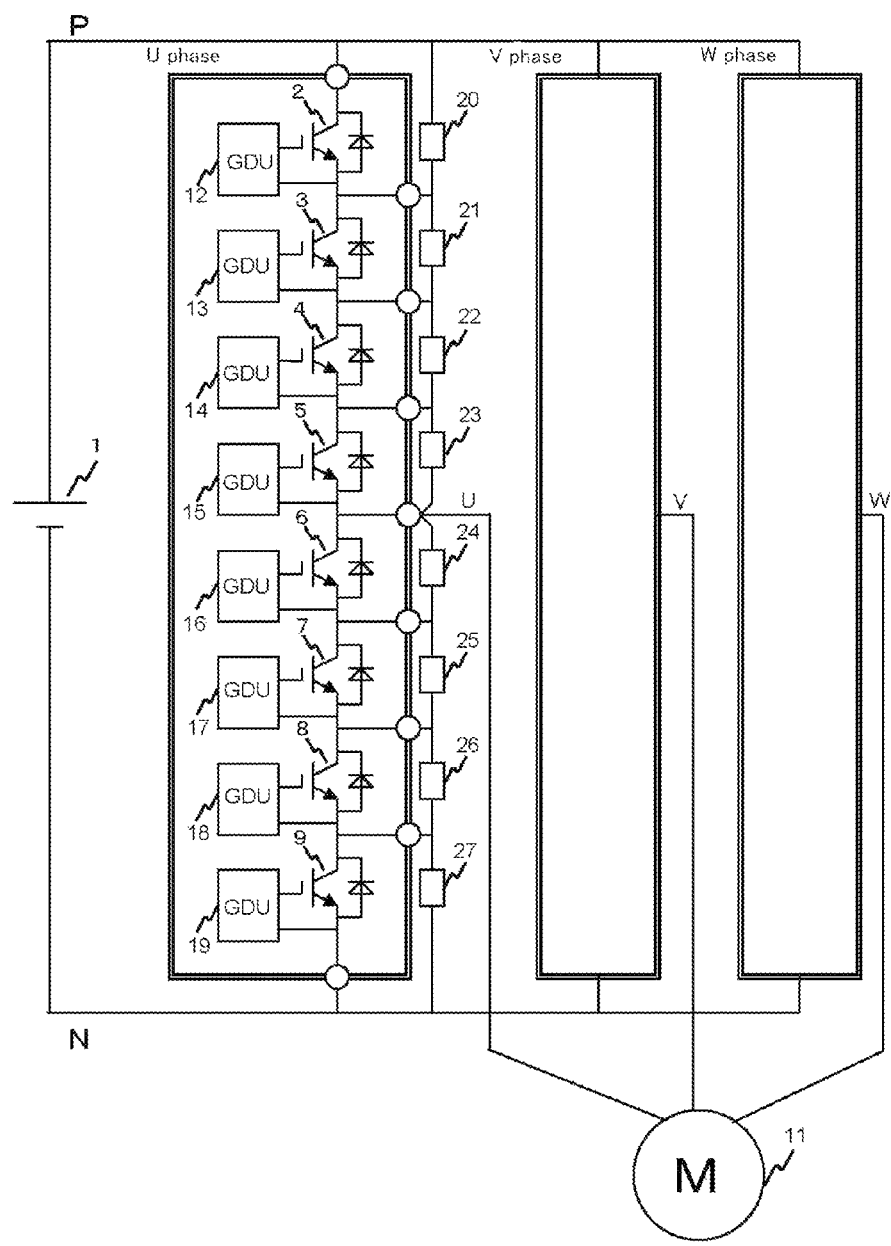
FIG. 7 shows an example of two-level inverter circuit comprising a multiple of series-connected switching devices.

FIG. 6 shows the second embodiment of the present invention. The circuit of FIG. 6 determines whether a short-circuit fault has occurred in a semiconductor switching device of the own arm of the upper and lower arms or in a semiconductor switching device of the other arm of the upper and lower arms, corresponding to a command signal of switching ON or switching OFF to the semiconductor switching device. FIG. 6 shows the circuit in the primary side of the photo-coupler 35 and the circuit in the secondary side of the photo-coupler 47. Logic circuits 73 and 74 determine whether the other arm is in a short-circuited state or the own arm is in a short-circuited state corresponding to the output of the photo-coupler 47 and the command signal 72 from a dead time circuit 33 to the IGBT S1. This circuit indicates a fault state by an ON state of the photo-transistor of the photo-coupler 47, that is, a low level of the output of the photo-coupler 47, and indicates an ON state of the IGBT S1 by a high level of the command signal 72 to the IGBT S1. The logic circuit 73 determines a short-circuit fault in the other arm receiving the signal 72 that is a signal 29 from a control circuit 28 with a dead time added in a dead time adding circuit 33 and the secondary side signal of the photo-coupler 47.

A short-circuit fault in the other arm is confirmed if a current flows through the primary side diode of the photo-coupler 47 and the secondary side photo-transistor turns ON when an OFF signal is given to the other arm and an ON signal is given to the own arm. A short-circuit fault in the own arm is identified by giving two signals to the logic circuit 74: one of the two signals is a signal 72 that is a signal 29 from the control circuit 28 to which a dead time is added by the dead time adding circuit 33, and the other signal is the secondary signal of the photo-coupler 47 passed through a masking circuit 75 in a dead time period. In other words, the short-circuit fault in the own arm is confirmed if a current flows through the primary side diode of the photo-coupler 47 and the secondary side photo-transistor turns ON when an ON signal is given to the other arm and an OFF signal is given to the own arm. When a current is flowing through the diode anti-parallel-connected to the IGBT S1 during the dead time period in which an OFF signal is given to the IGBTs of both of the upper and lower arms, the collector-emitter voltage of the IGBT S1 is approximately zero volts despite the OFF command input. Consequently, a short-circuit fault signal is delivered from the photo-coupler 47 in the operation mode shown in FIG. 5. The masking circuit 75 in a dead time period put in the preceding stage of the logic circuit 74 avoids erroneous determination of a short-circuit fault in the own arm during a dead time period.

As explained above, the signal from the photo-coupler 47 in the own arm enables discrimination between a short-circuit fault in the own arm and a short-circuit fault in the other arm. Therefore, it is possible in a two level inverter circuit to eliminate the short-circuit fault detecting circuit in the gate driving circuit of one of the upper and lower arms.

Whereas the embodiment example shown above is a gate driving circuit for one IGBT of a plurality of series-connected IGBTs, the gate driving circuits for the other series-connected IGBTs need to have the same construction as the one described above. While the embodiment example shown above is related to an two-level inverter circuit, the present invention can be applied to multilevel conversion circuits of three or more levels comprising a multiple of semiconductor switching devices and DC power supplies connected in series. The semiconductor switching device can be a voltage-driven device such as a MOSFET as well as an IGBT. Although the power supply for the gate driving circuit is a two-power supply system consisting of the positive side and negative side power supplies 40 and 41 in the embodiment example described above, a single power supply system can be used as well.

Embodiments of the invention provide, in the gate driving circuit thereof, a control circuit technology for detecting a short-circuit fault of a switching device in a power conversion circuit having a plurality of semiconductor switching devices connected in series in one arm. Embodiments of the invention can be applied to high voltage motor driving equipment, power converters for system interconnection, and instantaneous voltage drop compensator.

What is claimed is:

1. A gate driving circuit having a circuit for detecting a short-circuit fault of a semiconductor switching device, the gate driving circuit driving semiconductor switching devices in a power conversion circuit for converting a DC power to an AC power or converting an AC power to a DC power, the power conversion circuit comprising a DC power supply and an upper and lower arm circuit composed of an upper arm and a lower arm connected in series, each arm comprising two or more semiconductor switching devices connected in series, each semiconductor switching device having an anti-parallel connected diode, and the power conversion circuit being connected in parallel to the DC power supply and the upper and lower arm circuit, the gate driving circuit comprising:

a series circuit including a diode and a resistor between a positive potential terminal of a positive side power supply of the gate driving circuit and a positive electrode of the semiconductor switching device;

wherein the gate driving circuit determines a short-circuit fault of the semiconductor switching device connected with the gate driving circuit by means of a current that flows through the series circuit including the diode and the resistor upon receiving an OFF command of ON/OFF command signals to the semiconductor switching device.

2. The gate driving circuit having a circuit for detecting a short-circuit fault of a semiconductor switching device according to claim 1, wherein the gate driving circuit comprises a circuit for detecting a power supply short-circuit current from the DC power supply that flows when the other arm of opposing upper and lower arms becomes into a short-circuit fault state.

3. The gate driving circuit having a circuit for detecting a short-circuit fault of a semiconductor switching device according to claim 1, wherein the gate driving circuit comprises a bypass circuit that prohibits current flow through the diode in the series circuit including the diode and the resistor upon receiving an ON command of ON/OFF command signals to the semiconductor switching device.

4. The gate driving circuit having a circuit for detecting a short-circuit fault of a semiconductor switching device according to claim 1, wherein the series circuit including the diode and the resistor is a series connected circuit comprising the diode, the resistor, and a Zener diode.

5. The gate driving circuit having a circuit for detecting a short-circuit fault of a semiconductor switching device according to claim 1, wherein the series circuit including the diode and the resistor comprises a primary side device of a photo-coupler disposed on a current path through the series circuit, and transmits a short-circuit fault state of the semiconductor switching device to a secondary side of the photo-coupler by means of a current flowing through the series circuit comprising the diode, the resistor, and the photo-coupler.

6. The gate driving circuit having a circuit for detecting a short-circuit fault of a semiconductor switching device according to claim 5, wherein the signal transmission to a circuit disposed in the secondary side of the photo-coupler is performed by means of an isolating component selected from components including an optical fiber and a transformer in place of the photo-coupler.

7. The gate driving circuit having a circuit for detecting a short-circuit fault of a semiconductor switching device according to claim 5, wherein a photo-coupler for detecting a short-circuit fault of a semiconductor switching device in one of the upper and lower arms serves simultaneously as a photo-coupler for transmitting detection of an arm short-circuit current in a short-circuit fault of a semiconductor switching device in the other arm to the secondary side of the photo-coupler.

8. The gate driving circuit having a circuit for detecting a short-circuit fault of a semiconductor switching device according to claim 7, wherein the gate driving circuit comprises a circuit, in the secondary side of the photo-coupler, for determining whether a short-circuit fault has occurred in a semiconductor switching device in the own arm of the upper and lower arms or in a semiconductor switching device in the other arm of the upper and lower arms using an ON or OFF switching command to the semiconductor switching device.

9. The gate driving circuit having a circuit for detecting a short-circuit fault of a semiconductor switching device according to claim 8, wherein the gate driving circuit comprises a masking circuit that prohibits determining operation during a dead time period in a process for determining, in the secondary side of the photo-coupler, whether a short-circuit fault has occurred in a semiconductor switching device of the own arm or of the other arm using an OFF switching command to the semiconductor switching device.

\* \* \* \* \*